(12) United States Patent
Yano et al.

(10) Patent No.: US 7,683,484 B2
(45) Date of Patent: Mar. 23, 2010

(54) BUMP STRUCTURE, METHOD OF FORMING BUMP STRUCTURE, AND SEMICONDUCTOR APPARATUS USING THE SAME

(75) Inventors: Yuji Yano, Tenri (JP); Kazuo Tamaki, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 104 days.

(21) Appl. No.: 11/790,143

(22) Filed: Apr. 24, 2007

(65) Prior Publication Data
US 2007/0252272 A1 Nov. 1, 2007

(30) Foreign Application Priority Data
May 1, 2006 (JP) ............... 2006-127813

(51) Int. Cl.
*H01L 23/48* (2006.01)
(52) U.S. Cl. ............... 257/737; 257/738; 257/780; 257/E23.021
(58) Field of Classification Search ............ 257/737, 257/738, 780, E23.021
See application file for complete search history.

(56) References Cited

U.S. PATENT DOCUMENTS

| | | | |
|---|---|---|---|
| 5,842,628 A | 12/1998 | Nomoto et al. | |
| 6,268,662 B1 | 7/2001 | Test et al. | |
| 6,495,773 B1 | 12/2002 | Nomoto et al. | |
| 6,674,166 B2 * | 1/2004 | Rao et al. | 257/738 |
| 7,044,357 B2 | 5/2006 | Mii | |
| 7,192,861 B2 * | 3/2007 | Ano | 438/617 |
| 2004/0026480 A1 | 2/2004 | Imai et al. | |
| 2004/0090756 A1 * | 5/2004 | Ho et al. | 361/767 |
| 2004/0104477 A1 * | 6/2004 | Fujisawa | 257/738 |
| 2004/0152292 A1 * | 8/2004 | Babinetz et al. | 438/617 |
| 2004/0164128 A1 | 8/2004 | Mii | |
| 2005/0133928 A1 * | 6/2005 | Howard et al. | 257/773 |

FOREIGN PATENT DOCUMENTS

| | | |
|---|---|---|
| JP | 4-29389 A | 2/1993 |
| JP | 5-29389 A | 2/1993 |
| JP | 6-151520 A | 5/1994 |
| JP | 8-264540 | 10/1996 |
| JP | 2000-311915 A | 11/2000 |
| JP | 2001-176908 | 6/2001 |
| JP | 2001-189338 A | 7/2001 |
| JP | 2002-76048 | 3/2002 |
| JP | 2002-329742 | 11/2002 |
| KR | 10-0227205 B1 | 7/1999 |
| KR | 10-0227205 B1 | 10/1999 |
| KR | 10-2004-0014111 A | 2/2004 |

* cited by examiner

*Primary Examiner*—Tuan N. Quach
(74) *Attorney, Agent, or Firm*—Nixon & Vanderhye, PC

(57) ABSTRACT

A bump structure includes a squashed ball provided on an electrode pad, and a wire provided on the squashed ball. The wire is a wire loop that is loop-shaped and is formed so as to protrude from an end part of the squashed ball. This provides high bonding reliability between a bonding pad and the bump structure.

13 Claims, 6 Drawing Sheets

BUMP STRUCTURE, METHOD OF FORMING BUMP STRUCTURE, AND SEMICONDUCTOR APPARATUS USING THE SAME

This Nonprovisional application claims priority under 35 U.S.C. §119(a) on Patent Application No. 127813/2006 filed in Japan on May 1, 2006, the entire contents of which are hereby incorporated by reference.

FIELD OF THE TECHNOLOGY

The present technology relates to a bump structure, a method of forming the bump structure, and a semiconductor apparatus using the bump structure and the method of forming the bump structure. More particularly, the present technology relates to: a bump structure suitably applicable to flip-chip bonding that allows an electrode pad of a semiconductor chip to be miniaturized; a method of forming the bump structure; and a semiconductor apparatus using the bump structure and the method of forming the bump structure.

BACKGROUND OF THE TECHNOLOGY

In recent years, studies have been made on packages employing flip-chip bonding to mount a semiconductor apparatus on a circuit substrate. The flip-chip bonding utilizes a bump structure.

Patent Document 1 (Japanese Unexamined Patent Publication No. 264540/1996 (Tokukaihei 8-264540); publication date: Oct. 11, 1996) describes a conventionally-utilized bump structure that includes a first bump and a second bump. The first bump is substantially cylindrical and is made of a conductive material. A bottom surface of the first bump is fixed to an electrode. The second bump is substantially cylindrical and is made of a conductive material that is the same kind as that of the first bump. A bottom surface of the second bump is fixed to an upper surface of the first bump.

Patent Document 2 (Japanese Unexamined Patent Publication No. 2004-247672; publication date: Sep. 2, 2004) describes a conventionally-utilized method of forming a bump structure, which method includes the following six steps. In the first step, a ball is formed at a tip of a wire inserted in a capillary, and the ball is bonded to a conductor, thereby forming a squashed ball. In the second step, the capillary is moved upward and in a lateral direction so that a flat section of a lower end of the capillary is positioned to face the squashed ball. In the third step, the capillary is moved downward to press against the squashed ball, thereby forming a first bump. In the fourth step, the capillary is moved upward and in a lateral direction opposite to the lateral direction in which the capillary is moved in the second step so that the flat section of the lower end of the capillary is positioned to face the first bump. In the fifth step, the capillary is moved downward to bend the wire and then press the wire against the first bump, thereby forming a second bump. Finally in the sixth step, the wire is torn off from the second bump.

Patent Document 3 (Japanese Unexamined Patent Publication No. 2002-76048; publication date: Mar. 15, 2002) describes a conventionally-utilized method of arranging a bump structure. The method is for a case in which a chip component and a wiring board are bonded together by flip-chip bonding via bumps, which are protruded electrodes, formed on a plurality of pads, which are to serve as electrodes, arranged in line on a front surface of the chip component. According to the method, the bumps are disposed in such a manner that the positions of the bumps are shifted alternately in a direction substantially orthogonal to the direction in which the pads are arranged.

Patent Document 4 (Japanese Unexamined Patent Publication No. 2002-329742; publication date: Nov. 15, 2002) describes a conventionally-utilized semiconductor apparatus to be mounted on a circuit substrate by use of a bump structure. In the semiconductor apparatus, bonding pads, to which external connection wires or bumps are to be bonded, are disposed on a semiconductor chip in a zigzag pattern. Testing pads, with which probes are to be brought into contact in wafer testing, are provided in a residual space after the bonding pads are disposed in the zigzag pattern.

Patent Document 5 (Japanese Unexamined Patent Publication No. 2001-176908; publication date: Jun. 29, 2001) describes a method of producing a semiconductor apparatus. According to the method, a conductive bonding agent is prevented from extending, in a direction of an adjacent electrode, on a semiconductor carrier. Further, an area of a head section (upper section) of a bump is enlarged. With the method, a sufficient amount of the conductive bonding agent is provided to the bump, and adjacent electrodes are connected electrically stably without short-circuit.

The following describes what disclosed in Patent Document 5, with reference to FIGS. 7(a) to 7(d) and FIGS. 8(a) and 8(b). Specifically, the following describes in detail the conventional bump structure for flip-chip bonding, the method of forming the bump structure, and the structure of the flip-chip bonding.

FIGS. 7(a) to 7(d) show the bump structure and the method of forming the bump structure. Wire bonding is carried out with respect to an electrode pad 102. As shown in FIG. 7(a), a ball 116 is formed at a tip of a wire 115, which tip is at a tip section of a capillary 114. Then, as shown in FIG. 7(b), ultrasonic frequency is applied to the electrode pad 102 so that the ball 116 is thermally squashed with the use of the capillary 114, thereby forming a squashed ball 117a. Then, as shown in FIG. 7(c), the capillary 114 is moved upward, and at the same time, moved either parallel or upward to the left/right, thereby tearing the wire 115 off to form a tail section 117b. Then, as shown in FIG. 7(d), leveling is carried out to make the height even, thereby forming a bump structure 118 in which the tail section 117b is formed on the squashed ball 117a.

FIGS. 8(a) and 8(b) show the structure of the flip-chip bonding with the bump structure. A bump structure 218, constituted of a pedestal section 217a and a tail section 217b, is formed on an electrode pad 202 of a semiconductor chip 201. The bump structure 218 is bonded to a bonding pad 207, which is formed in a base substrate 211, via a conductive resin 212. The semiconductor chip 201 is mounted, with its surface facing downward to the base substrate 211. Seal resin 213 is filled in between the semiconductor chip 201 and the base substrate 211, and is hardened.

With the bump structure 218 employed in the flip-chip bonding, the tail sections 217b are disposed in a zigzag pattern, as shown in FIG. 8(b), so that a distance between bonding pads 207 is widened. This reduces a risk of short-circuit in between adjacent electrodes.

However, the foregoing conventional bump structure, method of producing the bump structure, and the semiconductor apparatus using the bump structure have the following problems. Specifically, bonding reliability is low between the bump structure and the bonding pad. Further, the degree of freedom is low in designing a structure of a semiconductor apparatus exemplified by a bonding pad. Furthermore, mechanical stress is not absorbed efficiently.

For example, in the method shown in FIGS. 7(a) to 7(d), the tail section 117b is formed by tearing off the wire 115. This causes the length of the tail section 117b to be unstable.

The method therefore has a problem that bonding reliability is low between the tail section 117b and the bonding pad (not illustrated). Further, to make the length of the tail section 117b stable in the foregoing method, leveling is necessary. This causes costs to increase.

Further, it is extremely difficult in the foregoing conventional methods to adjust the length and the direction of the tail section. Therefore, even when the bump structure 218 is arranged in the zigzag pattern as shown in FIG. 8(b), it is difficult to keep a sufficient distance between bonding pads. Thus, there remains a risk of short-circuit. Further, as shown in FIG. 8(a), the position of the bonding pad 207 is determined automatically by the position of the electrode pad 202 formed on the semiconductor chip 201. Therefore, there is a problem that the degree of freedom is low in designing the wiring 208. Further, if progress is to be made in narrowing the pitch of the electrode pads 202 on the semiconductor chip 201 (for example, the distance between the electrode pads 202 is narrowed to 60 μm or below), the following problems arise. Specifically, it becomes difficult to equalize the distance between the bonding pads 207 with the distance between the electrode pads 202. Further, costs of the base substrate 211 increase extremely. Furthermore, the bonding pads 207 are no longer allowed to have a wide width. Therefore, an area where the bonding pad 207 and the bump structure 218 are bonded to each other decreases, and a volume of the bump structure 218 decreases. This degrades bonding reliability of a section where the bonding pad 207 and the bump structure 218 are bonded together. Moreover, there is another problem that it becomes difficult for the bump structure 218 to absorb mechanical stress applied to a section where the bump structure 218 and the electrode pad 202 are bonded together and to the section where the bump structure 218 and the bonding pad 207 are bonded together.

SUMMARY OF THE TECHNOLOGY

The present technology has as an object to provide a bump structure in which a bump absorbs mechanical stress efficiently to allow high bonding reliability between a bonding pad and the bump structure. The present technology also has as an object to provide a method of forming the bump structure and a semiconductor apparatus using the bump structure.

To attain the objects, a bump structure is adapted so that the bump structure includes: a squashed ball provided on an electrode pad; and a wire provided on the squashed ball, the wire being a wire loop that is loop-shaped and is formed so as to protrude from an end part of the squashed ball.

With this structure, the wire loop is formed so as to protrude from the end part of the squashed ball. This makes it possible to form the bump structure in such a manner that the bonding pad and the electrode pad that are positioned apart from each other are bonded together. This allows the bonding pad to be formed anywhere on the base substrate without being restrained by the positions of the electrode pads formed on the semiconductor chip. For example, the distance between adjacent bonding pads may be widened. This makes it possible to pass a wiring in between bonding pads or to reduce the risk of short-circuits in between bonding pads. Further, the bonding pads may be designed with an increased size. This makes it possible to improve bonding reliability between the bump structure and the bonding pad. Further, as described above, the degree of freedom increases in wiring on the base substrate. This makes it possible to reduce costs of the base substrate. Further, the bump structure includes the wire loop that is loop-shaped. This makes it possible to further improve the bonding reliability and to absorb mechanical stress efficiently.

To attain the objects, the bump structure is adapted so that the bump structure includes: a squashed ball provided on an electrode pad; and a plurality of wires each provided on the squashed ball, the plurality of wires each being a wire loop that is loop-shaped and is formed so as to protrude from an end part of the squashed ball, and the wire loop being formed in such a manner that a plane formed by the wire loop surrounding the plane is at least either orthogonal or substantially parallel to a front surface of the electrode pad.

With this structure, the plurality of wire loops extend from one squashed ball. This makes it possible to absorb greater mechanical stress, compared to a case in which only one wire loop extends from a squashed ball. Therefore, bonding reliability improves between the bump structure and the bonding pad. For example, the mechanical stress is high especially in a corner section of the semiconductor chip. Accordingly, if the bump structure is formed in the corner section of the electrode pad, and if the electrode pad is bonded to the bonding pad via a plurality of bonding points, the percentage of open fault is reduced. This improves the bonding reliability.

To attain the objects, a semiconductor apparatus is adapted so that the semiconductor apparatus includes a bump structure including: a squashed ball provided on an electrode pad; and a wire provided on the squashed ball, the electrode pad being provided on a semiconductor chip and bonded, via the bump structure by flip-chip bonding, to a bonding pad provided on a base substrate, and the wire being a wire loop that is loop-shaped and is formed so as to protrude from an end part of the squashed ball.

With this structure, an area where the bump structure is bonded to the bonding pad increases, and the wire loop is formed of the loop-shaped wire. This makes it possible to absorb mechanical stress efficiently. Therefore, bonding reliability improves between the bump structure and the bonding pad.

To attain the objects, a method of forming the bump structure is adapted so that the method includes: a first step of forming a ball at a tip of a wire passed through a capillary, and moving the capillary downward to press the ball against the electrode pad so that a squashed ball is formed and fixed to the electrode pad; a second step of moving the capillary upward and in a first lateral direction so that a tip section of the capillary is positioned so as to protrude from an end part of the squashed ball; a third step of moving the capillary downward in such a manner that the tip section of the capillary does not press against the squashed ball; a fourth step of moving the capillary upward and in a second lateral direction opposite to the first lateral direction; a fifth step of forming a wire loop on the squashed ball by moving the capillary downward to press the wire against the squashed ball so that the wire is fixed to the squashed ball, the wire loop being a wire that is loop-shaped; and a sixth step of cutting off the wire from the wire loop.

With this structure, the wire loop is formed with good reproducibility at low costs, which wire loop is loop-shaped and is formed so as to protrude from the end part of the squashed ball.

Additional objects, features, and strengths of the present technology will be made clear by the description below. Further, the advantages of the present technology will be evident from the following explanation in reference to the drawings.

DESCRIPTION OF THE EMBODIMENTS

Figure 1:
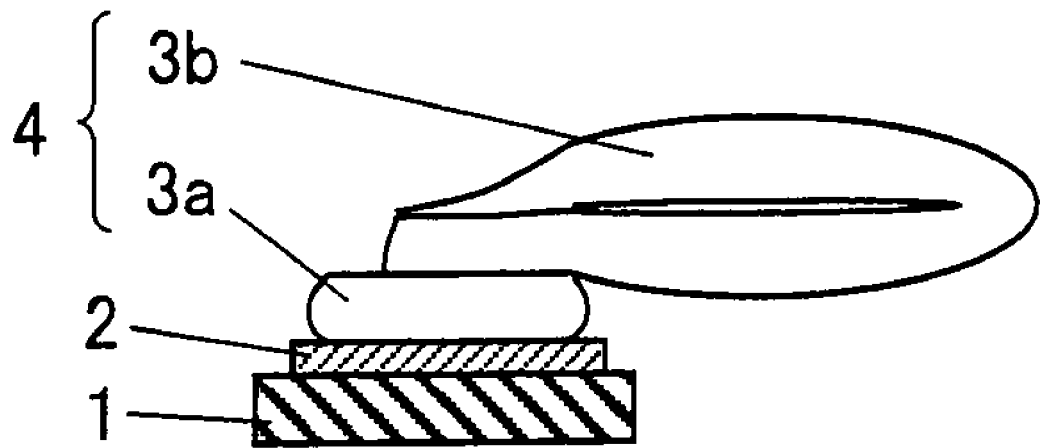
FIG. 1(a) is a sectional view showing a bump structure.
FIG. 1(b) is a plan view showing the bump structure of FIG. 1(a).
Figure 1:
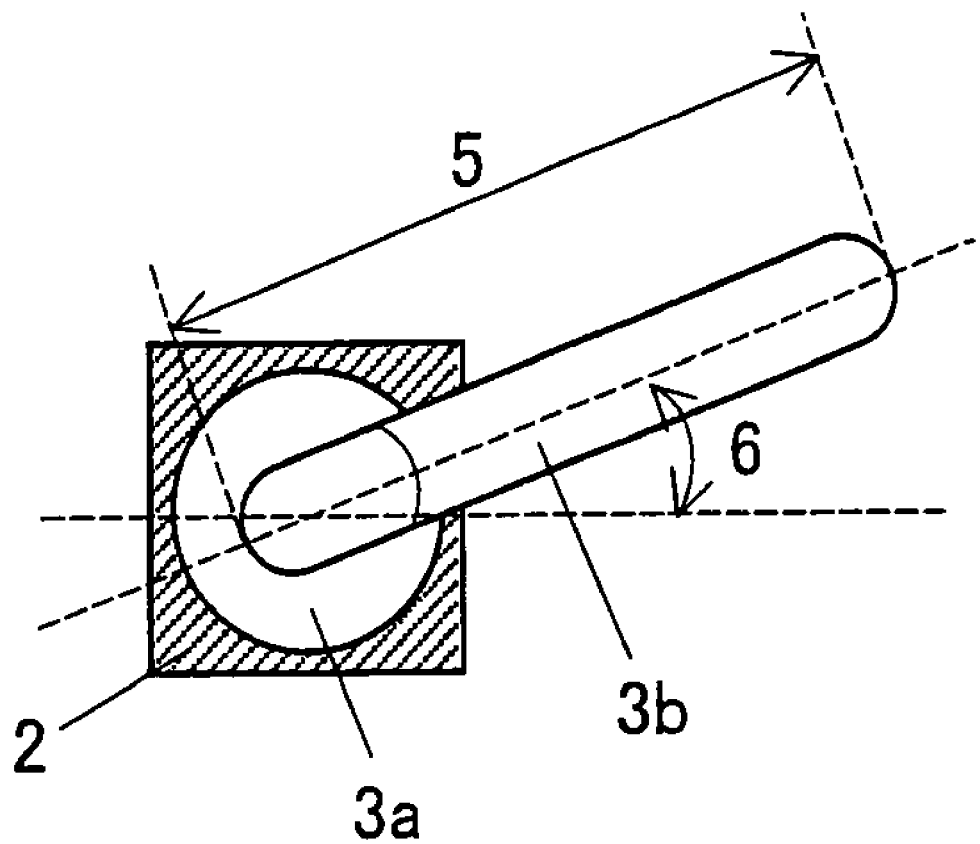
Figure 2:
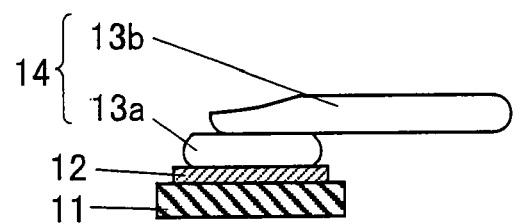
FIG. 2(a) is a sectional view showing a bump structure.
FIG. 2(b) is a plan view showing the bump structure of FIG. 2(a).
Figure 2:
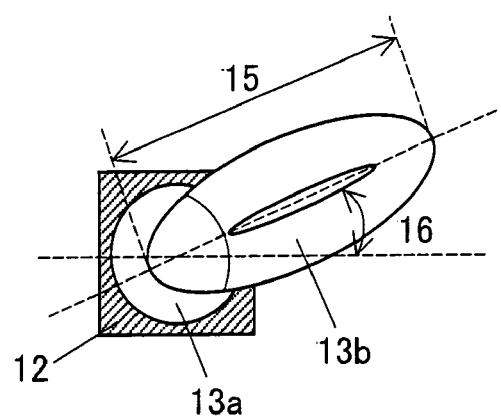

The following describes an embodiment of the present technology, with reference to FIGS. 1 to 6.

Embodiment 1

FIG. 1(a) is a sectional view of a bump structure of Embodiment 1. FIG. 1(b) is a plan view showing the bump structure. As shown in FIGS. 1(a) and 1(b), an electrode pad 2 is provided on a semiconductor chip 1 in the bump structure of the present embodiment. A squashed ball 3a is provided on the electrode pad 2. A wire loop 3b is formed of a loop-shaped wire and extends from the squashed ball 3a. The wire loop 3b is formed so as to protrude from an end part of the squashed ball 3a. In the present Specification, "protrude from an end part of a squashed ball" implies that the wire loop extending from the squashed ball exists not only on and above the squashed ball but also outside of the end part of the squashed ball.

In the bump structure of the present embodiment, the wire loop 3b is formed of a loop-shaped wire, as described above. The shape of this loop is not particularly limited, as long as one end part of the wire loop is connected to the other end part of the wire loop. It is preferable that the shape of the loop be an ellipse or a circle, for example. Further, any publicly known wires may be employed as the wire constituting the bump structure.

In the bump structure of the present embodiment, the wire loop is disposed in such a manner that a plane formed by the loop-shaped wire surrounding the plane is vertical to a front surface of the electrode pad 2. The front surface of the electrode pad 2 implies a surface of the electrode pad 2, which surface is in contact with the squashed ball 3a.

As shown in FIG. 1(b), the wire loop 3b has a length 5, and is provided at an angle 6 with respect to the electrode pad 2.

The length 5 of the wire loop 3b is not particularly limited, as long as the length 5 is sufficient for the wire loop 3b to protrude from the end part of the squashed ball 3a. The length 5 is not particularly limited, as long as the length 5 is, for example, sufficient for the electrode pad 2, on which the bump structure 4 is to be formed, to be connected to a bonding pad (not illustrated) to which the electrode pad 2 is to be connected.

The angle 6 of the wire loop 3b is not particularly limited, as long as the angle 6 is sufficient for the electrode pad 2, on which the bump structure 4 is to be formed, to be connected to the bonding pad (not illustrated) to which the electrode pad 2 is to be connected.

The following describes the method of forming the bump structure in accordance with the present embodiment, with reference to FIGS. 4(a) to 4(d).

The method of the present embodiment includes the first to sixth steps.

In the first step, a ball 56 is formed at a tip section of a wire 55 passed through the inside of a capillary 54, as shown in FIG. 4(a). Methods of forming the ball 56 are not particularly limited, and any publicly known methods may be employed. For example, the ball 56 may be formed by spark discharge. Then, as shown in FIG. 4(b), the capillary 54 is moved downward to press the ball 56 against an electrode pad 52. At this time, ultrasonic frequency is applied to the electrode pad 52 to thermally squash the ball 56 with the use of the capillary 54, thereby forming a squashed ball 53a.

Then, in the second to fifth steps, a loop-shaped wire loop is formed. The following describes this in detail, with reference to FIGS. 4(c) and 4(d). In FIG. 4(c), arrows (S1 to S6) indicate paths along which the tip section 54a of the capillary 54 is moved. In FIG. 4(c), positions A to C indicate positions on the paths along which the tip section 54a is moved. Position A is above a start point from which the wire-loop 53b extends from the squashed ball 53a. The height of position A from the electrode pad 52 is not particularly limited. Position B corresponds to the position of the bonding pad in a case in which the wire loop 53b is bonded to the bonding pad. Position C is below position B. The height of position C from the electrode pad 52 is not particularly limited, but it is preferable that the height be approximately the same as the height of the start point from the electrode pad 52.

As shown in FIG. 4(c), in the second step, the capillary 54 is moved upward (S1) to position A. Then, the capillary 54 is moved in a lateral direction (S2) to position B. This movement in the lateral direction only includes movement in an X-axis direction or movement in a Y-axis direction, where the X-axis direction and the Y-axis direction are directions with which the front surface of the electrode pad 52 is defined, and a Z-axis direction is a direction vertical to the front surface. The movement in the lateral direction implies a linear movement from position A to position B.

The length of the wire loop 53b is adjustable by adjusting the distances of movements in S1 and S2. Further, the direction along which the wire loop 53b is to be formed is adjustable by choosing the direction along which the capillary 54 is to be moved in S2. After having been moved, the tip section 54a of the capillary 54 is positioned so as to protrude from the end part of the squashed ball 53a.

In the third step, the capillary 54 is moved downward from position B to position C in such a manner that the tip section 54a of the capillary 54 does not press against the squashed ball 53a (S3).

Mechanical stress on the section where the electrode pad 52 and the squashed ball 53a are bonded together is reduced if (i) the tip section 54a of the capillary 54 is positioned so as to protrude from the end part of the squashed ball 53a when the capillary 54 is moved in the lateral direction (S2) to position B, and (ii) the tip section 54a does not press against the squashed ball 53a when the capillary 54 is moved downward (S3) to position C.

In the fourth step, the capillary 54 is moved upward (S4) to position B. Then, the capillary 54 is moved in a lateral direction (S5) opposite to the lateral direction in which the capillary 54 is moved in the second step. Consequently, the capillary 54 is moved to position A.

In the fifth step, the capillary 54 is moved downward to press the wire 55 against the squashed ball 53a, thereby forming the wire loop 53b on the squashed ball 53a, which wire loop 53b is formed of a loop-shaped wire as shown in FIG. 4(d).

In the sixth step, the wire 55 is cut off from the bump structure 57. Methods of cutting off the wire 55 are not particularly limited, and any publicly known methods may be employed. For example, while a clamper (not illustrated) and the capillary 54 are being moved upward together, the clamper is closed to cut off the wire 55 from a root of the bump structure 57.

As the foregoing describes, in the method of forming the bump structure in accordance with the present embodiment, the capillary 54 is moved in the X-axis direction and in the Z-axis direction as shown in FIG. 4(c), thereby forming the bump structure 57. This makes it possible to form the bump structure in which the plane of the wire loop, which plane is formed by the loop-shaped wire surrounding the plane, is disposed vertically to the front surface of the electrode pad 52.

Embodiment 2

FIG. 2(a) is a sectional view of a bump structure of Embodiment 2. FIG. 2(b) is a plan view of the bump structure. As shown in FIGS. 2(a) and 2(b), an electrode pad 12 is provided on a semiconductor chip 11 in the bump structure of the present embodiment. A squashed ball 13a is provided on the electrode pad 12. A wire loop 13b is formed of a loop-shaped wire, and extends from the squashed ball 13a. The wire loop 13b is formed so as to protrude from the squashed ball 13a.

In the bump structure of the present embodiment, the wire loop 13b is formed of a loop-shaped wire, as described above. The shape of this loop is not particularly limited, as long as one end part of the wire loop is connected to the other end part of the wire loop. It is preferable that the shape of the loop be an ellipse or a circle, for example. Further, any publicly known wires may be employed as the wire constituting the bump structure.

Further, in the bump structure of the present embodiment, the wire loop is disposed in such a manner that a plane formed by the loop-shaped wire surrounding the plane is parallel to a front surface of the electrode pad 12. The front surface of the electrode pad 12 implies a surface of the electrode pad 12, which surface is in contact with the squashed ball 13a.

As shown in FIG. 2(b), the wire loop 13b has a length 15, and is provided at an angle 16 with respect to the electrode pad 12. The length 15 is not particularly limited, as long as the length 15 is sufficient for the electrode pad 12, on which the bump structure 14 is to be formed, to be connected to a bonding pad (not illustrated) to which the electrode pad 12 is to be connected.

The angle 16 of the wire loop 13b is not particularly limited, as long as the angle 16 is sufficient for the electrode pad 12, on which the bump structure 14 is to be formed, to be connected to the bonding pad (not illustrated) to which the electrode pad 12 is to be connected.

The following describes the method of forming the bump structure in accordance with the present embodiment, with reference to FIGS. 5(a) to 5(d).

The method of the present embodiment includes the first to sixth steps. The first step in the method of forming the bump structure in accordance with Embodiment 1 may be employed as the first step of the present embodiment, and the fifth and sixth steps in the method of Embodiment 1 may be employed as the sixth step of the present embodiment. Therefore, description thereof is omitted. Accordingly, the following describes the second to fifth steps. In FIG. 5(c), arrows (S1 to S6) indicate paths along which a tip section 64a of a capillary 64 is moved. The dotted line in the figure indicates the path along which the tip section of the capillary of Embodiment 1 is moved.

Figure 5:
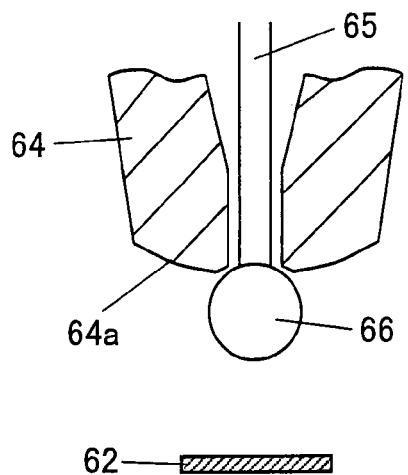
FIGS. 5(a) to 5(d) are schematic diagrams showing a method of forming a bump structure.
Figure 5:
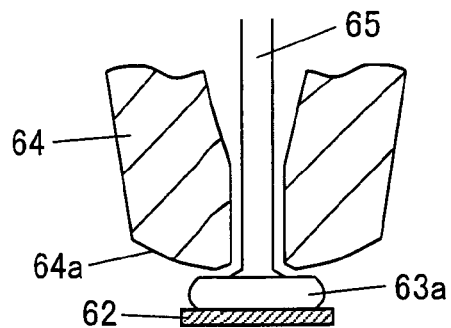
Figure 5:
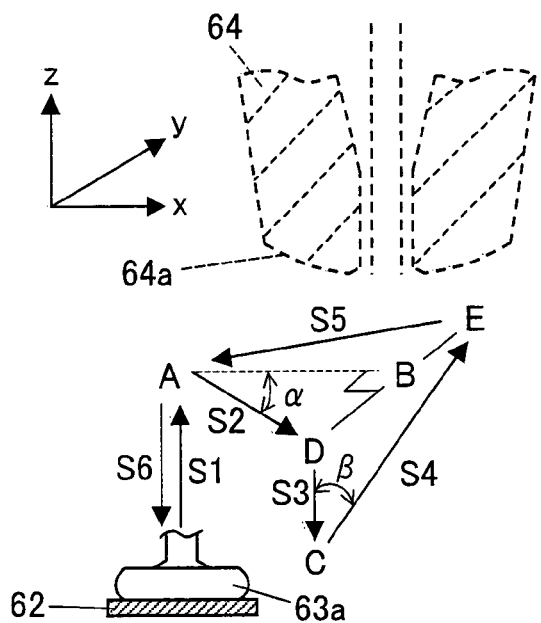
Figure 5:
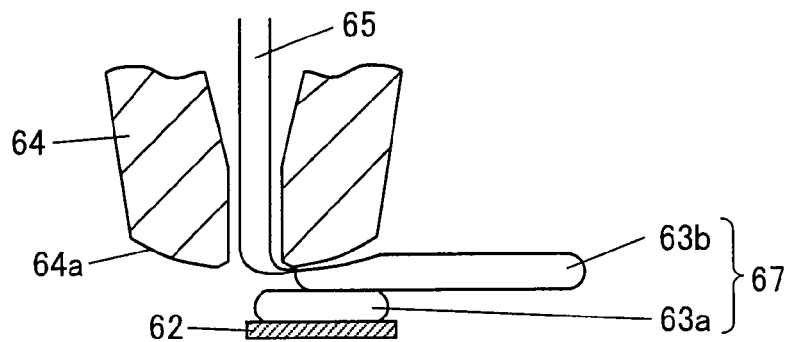

In the second step, the capillary 64 is moved upward (S1) to position A, as shown in FIG. 5. Then, the capillary 64 is moved in a lateral direction (S2) to position D, which forms an angle α with position B. This movement in the lateral direction only includes movement in an X-axis direction and movement in a Y-axis direction, where the X-axis direction and the Y-axis direction are directions with which a front surface of an electrode pad 52 is defined, and a Z-axis direction is a direction vertical to the front surface. The movement in the lateral direction implies a linear movement from position A to position D.

The length of a wire loop 63b is adjustable by adjusting the distance of movement in S2 and thus adjusting the distances of movements in S1 and S2. Further, the angle at which the wire loop 63b is to be formed is adjustable by choosing the direction in which the capillary 64 is to be moved in S2. After having been moved, the tip section 64a of the capillary 64 is positioned so as to protrude from an end part of a squashed ball 63a.

In the third step, the capillary 64 is moved downward substantially vertically (S3) from position D to position C in such a manner that the tip section 64a of the capillary 64 does not press against the squashed ball 63a.

In the fourth step, the capillary 64 is moved upward (S4) to position E. Then, the capillary 64 is moved in a lateral direction (S5) opposite to the lateral direction in which the capillary 64 is moved in the second step. Consequently, the capillary 64 is moved to position A. In S4, the capillary 64 is moved upward to the left/right toward position E, which is at an angle β with respect to position C. Position E does not need to be at the same height as position B. Further, position E does not need to be on a line extending from line DB. The angle at which the wire loop 63b is to be formed is adjustable by adjusting position E.

In the fifth step following the fourth step, the capillary 64 is moved from position E to position A.

This is followed by the sixth step. Consequently, the bump structure of the present embodiment is formed. The sixth step is same as the sixth step in the method of forming the bump structure in accordance with Embodiment 1. Therefore, description thereof is omitted.

As the foregoing describes, in the method of forming the bump structure in accordance with the present embodiment, the capillary 64 is moved not only in the X-axis direction and in the Z-axis direction but also in the Y-axis direction as shown in FIG. 5(c), whereby a bump structure 67 shown in FIG. 5(d) is formed. This makes it possible to form the bump structure in which the plane formed by the loop-shaped wire surrounding the plane is disposed substantially parallel to the surface of an electrode pad 62.

Embodiment 3

Figure 3:
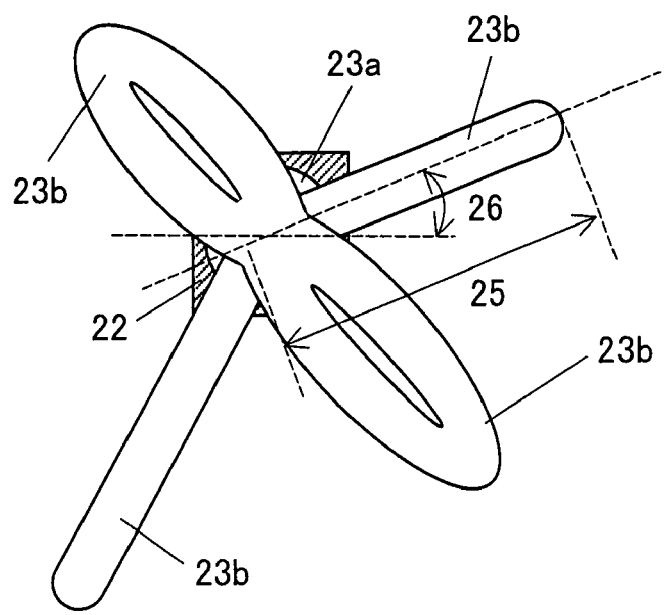
FIG. 3 is a plan view showing a bump structure.
Figure 4:
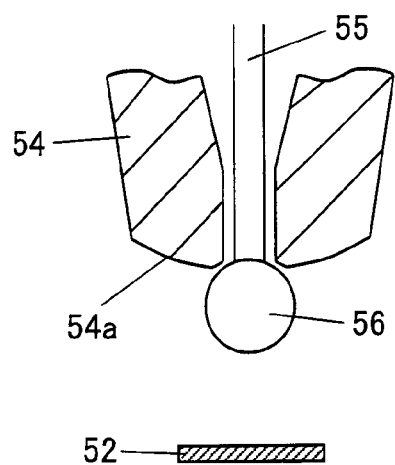
FIGS. 4(a) to (d) are schematic diagrams showing a method of forming a bump structure.
Figure 4:
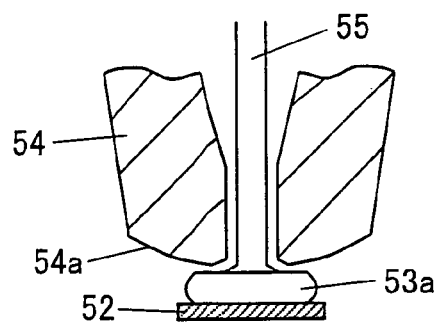
Figure 4:
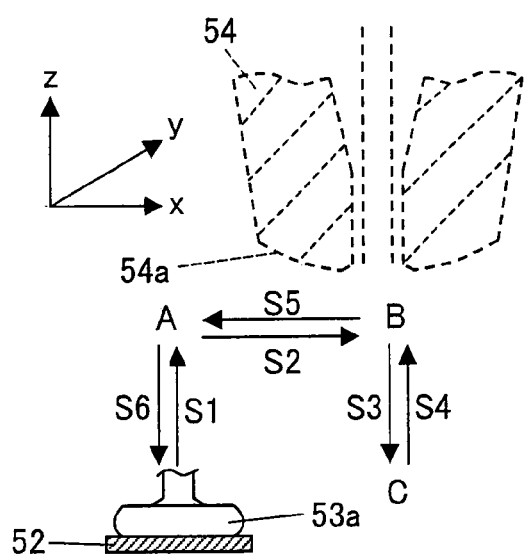
Figure 4:
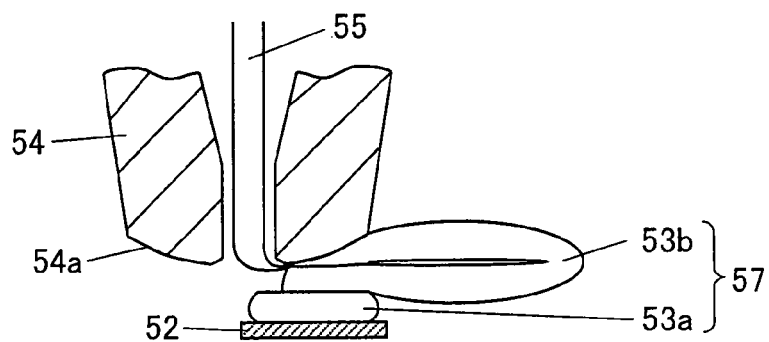

FIG. 3 is a plan view showing a bump structure of Embodiment 3. As shown in FIG. 3, an electrode pad 22 is provided on a semiconductor chip (not illustrated) in the bump structure of the present embodiment. A squashed ball 23a is provided on the electrode pad 22. A plurality of wire loops 23b, each of which is formed of a loop-shaped wire, extend from the squashed ball 23a. In other words, the plurality of wire loops 23b are formed on one squashed ball 23a. The bump structure of the present embodiment may include the wire loops 3b described in Embodiment 1 or the wire loops 13b described in Embodiment 2. It is also possible for the bump structure to include both the wire loop 3b described in Embodiment 1 and the wire loop 13b described in Embodiment 2. The bump structure of the present embodiment only needs to include the plurality of wire loops 23b formed on one squashed ball 23a. The number of the wire loops 23b formed on the squashed ball 23a is not particularly limited. In the case in which the bump structure includes both the wire loop 3b described in Embodiment 1 and the wire loop 13b described in Embodiment 2, neither the number of the wire loop 3b nor the number of the wire loop 13b is particularly limited. Each of the wire loops 23b is formed so as to protrude from an end part of the squashed ball 23a.

As described above, in the bump structure of the present embodiment, each of the wire loops 23b is formed of a loop-shaped wire. The shape of this loop is not particularly limited, as long as one end part of the wire loop is connected to the other end part of the wire loop. It is preferable that the shape of the loop be an ellipse or a circle, for example. Further, any publicly known wires to be employed to form a bump structure may be employed as the wires to form the wire loops 23b.

As shown in FIG. 3, each of the wire-loops 23b has a length 25, and is provided at an angle 26 with respect to the electrode pad 22.

The length 25 is not particularly limited, as long as the length 25 is sufficient for the wire loops 23b to protrude from the end part of the squashed ball 23a. The length 25 of each of the wire loops 23b may be set in a manner responsive to each of the wire loops 23b. Specifically, the lengths 25 of the wire loops 23b are not particularly limited, and may either differ from one another or same as the others. Further, the angles 26 of the wire loops 23b are not particularly limited, and may be set in a manner responsive to each of the wire loops 23b. It is preferable that the angles 26 be set in such a manner that the wire loops 23b extend in different directions from one another. Further, the lengths 25 of the wire loops 23b are not particularly limited, as long as the lengths 25 are sufficient for the electrode pad 22 to be connected to bonding pads (not illustrated) to which the electrode pads 22 are to be connected. Further, the angles 26 of the wire loops 23b are not particularly limited, as long as the angle 26 are sufficient for the electrode pad 22 to be connected to the bonding pads (not illustrated) to which the electrode pad 22 is to be connected.

The following describes the method of forming the bump structure in accordance with the present embodiment. In the bump structure of the present embodiment, the necessary number of the wire loops 3b described in Embodiment 1 and the necessary number of the wire loops 13b described in Embodiment 2 are formed on one squashed ball, and then, at the end, the sixth step is carried out only once to cut off the wire from the bump structure. In other words, a plurality of wire loops are formed without cutting off a wire, and then, at the end, the wire is cut off only once.

For example, the first to fifth steps in either the method of forming the wire loop 3b in accordance with Embodiment 1 or the method of forming the wire loop 13b in accordance with Embodiment 2 are carried out. Then, second bonding is carried out to bond the capillary to a top surface of the squashed ball, thereby forming a first wire-loop. Thereafter, the second to fifth steps in either the method of forming the wire loop 3b in accordance with Embodiment 1 or the method of forming the wire loop 13b in accordance with Embodiment 2 are carried out without cutting off the wire, thereby forming a second wire-loop. Then, the second to fifth steps in either the method of forming the wire loop 3b in accordance with Embodiment or the method of forming the wire loop 13b in accordance with Embodiment 2 are repeated so that a plurality of wire loops are formed on one squashed ball. Lastly, second bonding is carried out to bond the capillary to a top surface of the squashed ball, and the wire is cut off, thereby forming the bump structure of the present embodiment. The wire is cut off in accordance with the six step in the method of forming the bump structure in accordance with Embodiment 1.

Embodiment 4

A semiconductor apparatus utilizes, in flip-chip bonding, the bump structure described in any one of Embodiments 1 to 3. FIGS. 6(a) to 6(d) show the semiconductor apparatus. FIG. 6(a) is a plan view of the semiconductor. FIG. 6(b) is a sectional view taken along X1-Y1 indicated in FIG. 6(a). FIG. 6(c) is a sectional view taken along X2-Y2 indicated in FIG. 6(a). FIG. 6(d) is a sectional view taken along X3-Y3 indicated in FIG. 6(a).

As shown in FIGS. 6(b) to 6(d), in the semiconductor, an electrode pad 82 is formed on a semiconductor chip 81. The bump structure described in any one of Embodiments 1 to 3 is formed on the electrode pad 82. A wire loop 83b of the bump structure 84 is connected to a bonding pad 87 formed on a base substrate 91 via a conductive resin 92.

In the base substrate 91, the bonding pad 87 and a wiring 88 are formed on a base material 90. Solder resist 89 is formed on the base substrate 91 in such a manner that only a surface of the bonding pad 87 is revealed. The bonding pad 87 is electrically connected to an external connection terminal (not illustrated) of the semiconductor apparatus via the wiring 88. Seal resin 93 is filled in a space between the semiconductor chip 81 and the base substrate 91, and is hardened.

As shown in FIG. 6(a), by adjusting the distance of the wire loop 83b from an end part of a squashed ball 83a and the angle at which the wire-loop 83b is to be formed, it becomes possible to form the bonding pad 87 at anywhere on the base substrate 91 without being restrained by the positions of the electrode pads 82 formed on the semiconductor chip 81. For example, it is possible to widen the distance between adjacent bonding pads 87. This makes it possible to form a wiring 88 in between the bonding pads 87 and reduce the risk of short-circuit in between the bonding pads 87. Further, it is possible to design the bonding pad 87 in large size. This increases an area where the bump structure 84 and the bonding pad 87 are in contact with each other so that bonding reliability improves. Furthermore, costs of the base substrate 91 are reduced, and the degree of freedom in designing the wiring 88 increases.

The following specifically describes the base substrate 91. Methods of forming the wiring 88 and the bonding pad 87 on the base substrate 91 are not particularly limited, and any publicly known methods may be employed to form the wiring 88 and the bonding pad 87. For example a subtractive process or an additive process may be employed to form the wiring 88 and the bonding pad 87. The subtractive process has an advantage that costs are low. With the subtractive process, however, it is difficult to form the wiring 88 and the bonding pad 87 in such a way as to have the width of 40 μm or below. It is also difficult with the subtractive process to form the wiring 88 and the bonding pad 87 in such a manner that the distance between the wring 88 and the bonding pad 87 is 40 μm or below. On the other hand, the additive process has an advantage that the width of the wiring 88 and the width of the bonding pad 87 can be reduced to approximately 25 μm, and the distance between the wiring 88 and the bonding pad 87 can be reduced to approximately 25 μm.

The following describes the advantages of the present technology, using an exemplary case in which the electrode pads 82 are formed on the semiconductor chip 81 at a distance of 60 μm from each other.

With conventional flip-chip bonding, wiring needs to be formed in such a manner that the width of the bonding pad formed on the base substrate is 30 μm, and the distance between the bonding pads is 30 μm. Thus, the additive process needs to be employed in forming the base substrate, and therefore costs of the base substrate increase. Further, because the distance between the bonding pads is narrow, it is not possible to form a wiring in between the bonding pads. In other words, the degree of freedom in wiring is low. Further, because the distance between the bonding pads is narrow, the risk of short-circuit is high in between adjacent electrodes. Further, because the width of the bonding pads is narrow, high bonding reliability is not realizable in between the bonding pads and the bump structure.

On the contrary, it is possible to form the bonding pad 87 at anywhere on the base substrate 91. For example, it is possible to form a wiring in such a manner that the width of the bonding pad 87 is 60 μm, and the distance between bonding pads 87 is 125 μm. This allows the subtractive process to be employed in forming the base substrate 91, so that costs of the base substrate 91 become low. Further, one wiring 88 can be formed in between bonding pads 87 with the subtractive process, and two wirings 88 can be formed in between bonding pads 87 with the additive process. The degree of freedom in wiring therefore increases. Further, because the width of the bonding pad 87 is wide, sufficient bonding reliability is assured in between the bonding pads and the bump structure.

Inevitably, when the distance between the electrode pads 82 on the semiconductor chip 81 becomes 45 μm or below, it is difficult to form the wiring even with the additive process. Therefore, there arises a problem that flip-chip bonding cannot be carried out.

Figure 6:
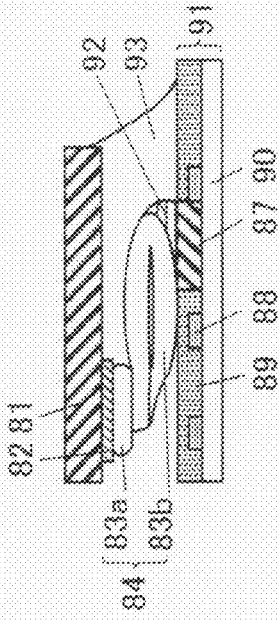
FIG. 6(a) is a schematic diagram showing a semiconductor apparatus in which semiconductor apparatus the bump structure is used in flip-chip bonding.
FIG. 6(b) is a sectional view taken along section line X1-Y1.
FIG. 6(c) is a sectional view taken along section line X2-Y2.
FIG. 6(d) is a sectional view taken along section line X3-Y3.
Figure 6:
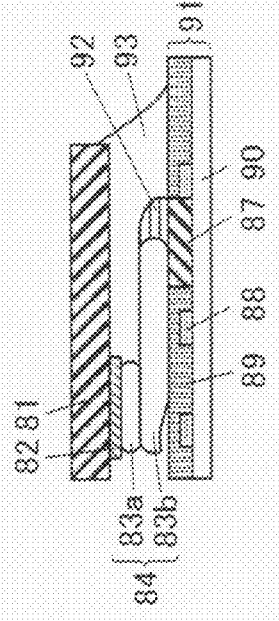
Figure 6:
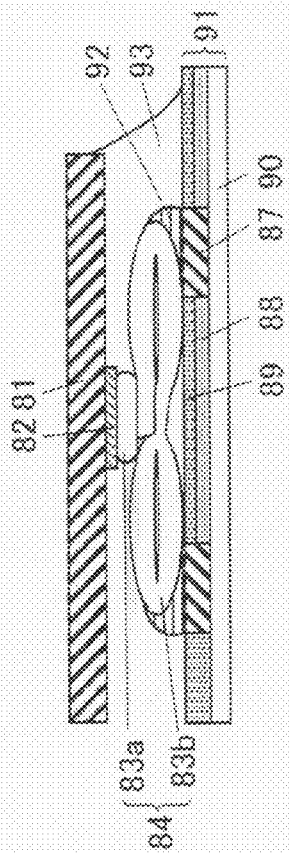
Figure 6:
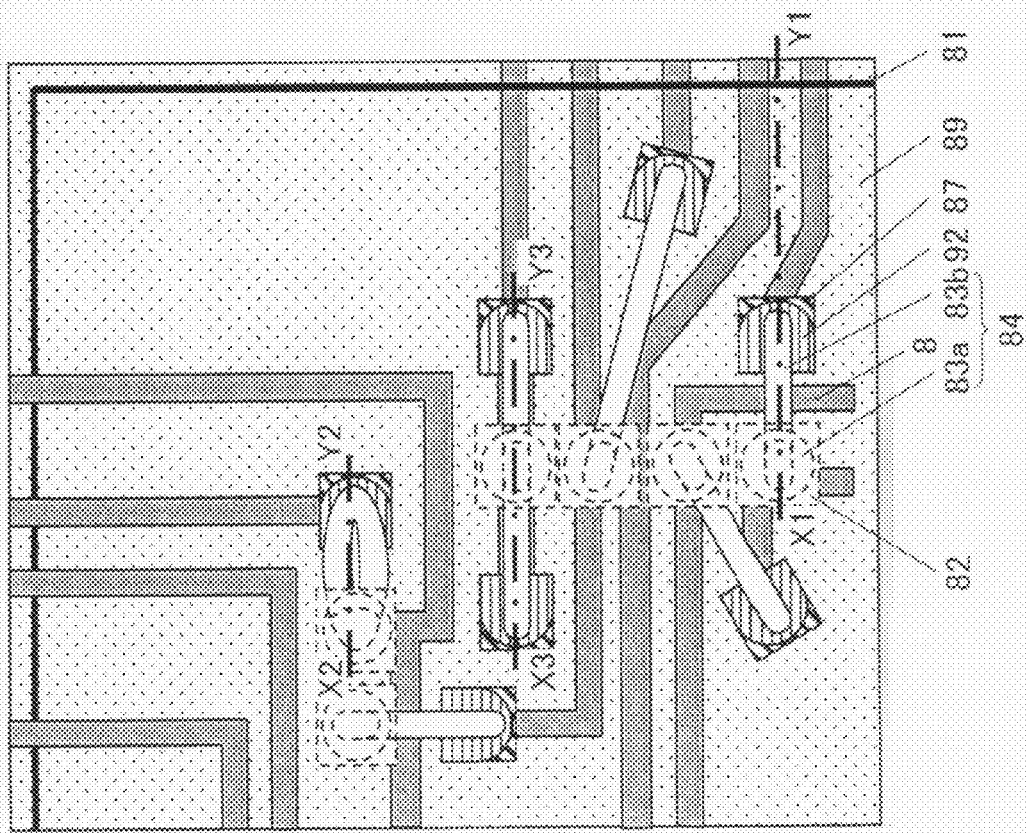
Figure 7:
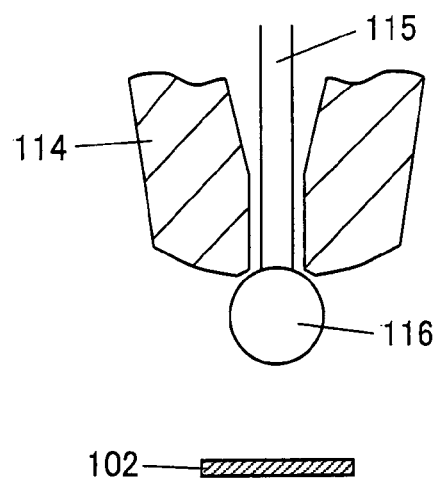
FIGS. 7(a) to 7(d) are schematic diagrams showing a conventional bump structure and a method of forming the conventional bump structure.
Figure 7:
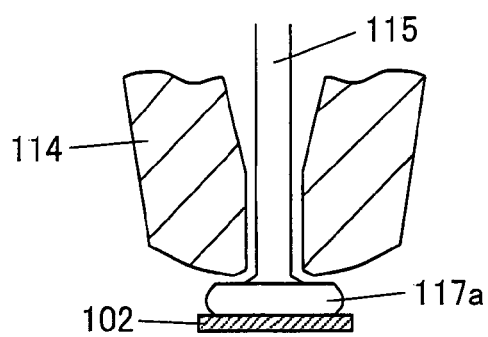
Figure 7:
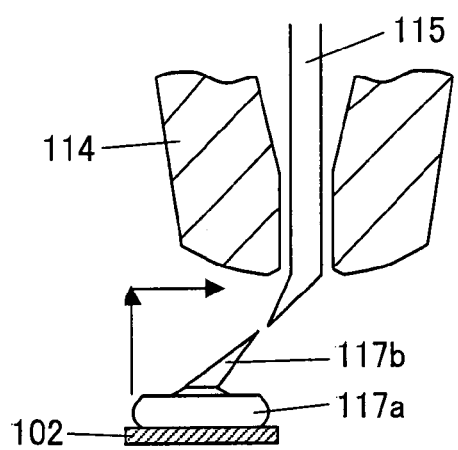
Figure 7:
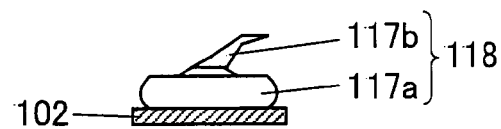
Figure 8:
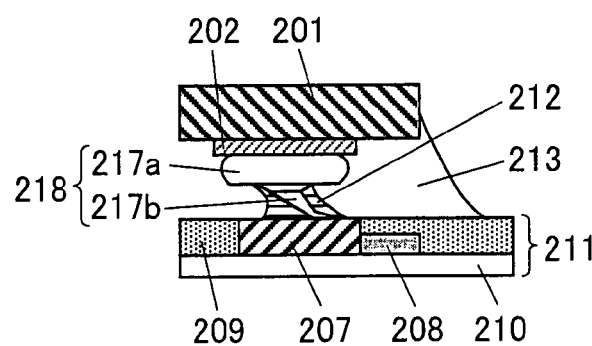
FIGS. 8(a) and 8(b) are schematic diagrams showing a structure of conventional flip-chip bonding.
Figure 8:
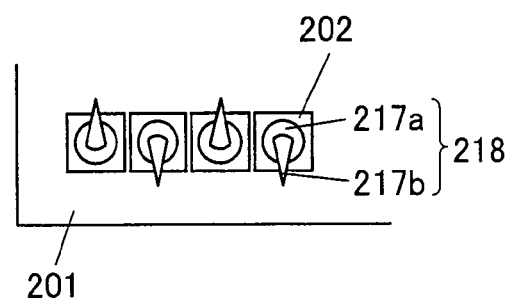

Further, as shown in FIGS. 6(*b*) to 6(*d*), the wire loops 83*b* that exist in between (i) a contact area where the electrode pad 82 and the bump structure 84 are in contact with each other and (ii) a contact area where the bonding pad 87 and the bump structure 84 are in contact with each other absorb mechanical stress applied after flip-chip bonding. This reduces damage to both of the contact areas, so that bonding reliability improves. The mechanical stress is high especially in a corner section of the semiconductor chip 81. Accordingly, if the bump structure of Embodiment 3 is formed on an electrode pad 82 formed in the corner section to provide a plurality of contact sections to be in contact with the bonding pad 87, a possibility of open fault is reduced, so that bonding reliability improves. Further, it is possible to connect a plurality of bump structures 84 with respect to one bonding pad 87. Further, because the bump structure has a loop-shaped wire loop, a contact area where the bump structure and the bonding pad 87 are in contact with each other is large. Therefore, contact reliability is high.

Therefore, providing the bump structure in the corner section of the semiconductor chip 81 contributes to improvement in bonding reliability.

As the foregoing describes, with the bump structure of the present technology, the method of forming the bump structure, and the semiconductor apparatus using the bump structure, the wire loop that is formed of a loop-shaped wire and protrudes from the end part of the squashed ball is provided. This produces an advantage that high bonding reliability is assured in between the bonding pads and the bump structure.

It is preferable in a bump structure of the present technology that the wire loop be formed in such a manner that a plane formed by the wire loop surrounding the plane is orthogonal to a front surface of the electrode pad.

With this structure, a contact area where the bump structure and the bonding pad are in contact with each other increases, and the wire loop is formed of a loop-shaped wire. This allows mechanical stress to be absorbed efficiently. Thus, bonding reliability improves in between the bump structure and the bonding pad. Further, the period of time to form a bump is shortened.

It is preferable in the bump structure of the present technology that the wire loop be formed in such a manner that a plane formed by the wire loop surrounding the plane is parallel to a front surface of the electrode pad.

With this structure, the contact area where the bump structure and the bonding pad are in contact with each other increases, compared to the bump structure in which the plane formed by the loop-shaped wire surrounding the plane is orthogonal to the front surface of the electrode pad, and the wire loop is formed of a loop-shaped wire. This allows mechanical stress to be absorbed efficiently. Thus, bonding reliability improves in between the bump structure and the bonding pad.

It is preferable in a semiconductor of the present technology that the bump structure be provided on the electrode pad in a corner section of the semiconductor chip.

With this structure, mechanical stress is absorbed efficiently especially in the corner section of the semiconductor chip, in which corner section the mechanical stress is especially high. This makes it possible to reduce a possibility of open fault in the semiconductor apparatus.

It is preferable in a method of forming a bump structure of the present technology that movement of the capillary in the first lateral direction and in the second lateral direction only include movement in an X-axis direction or movement in a Y-axis direction, where the X-axis direction and the Y-axis direction are directions with which a front surface of the electrode pad is defined, and a Z-axis direction is a direction vertical to the front surface.

With this structure, a bump structure is formed with excellent reproducibility, in which bump structure the plane formed by a loop-shaped wire surrounding the plane is formed so as to be orthogonal to the front surface of the electrode pad.

It is preferable in the method of forming the bump structure of the present technology that movement of the capillary in the first lateral direction and in the second lateral direction include movement in an X-axis direction and movement in a Y-axis direction, where the X-axis direction and the Y-axis direction are directions with which a front surface of the electrode pad is defined, and a Z-axis direction is a direction vertical to the front surface.

With this structure, a bump structure is formed with excellent reproducibility, in which bump structure the plane formed by a loop-shaped wire surrounding the plane is formed so as to be parallel to the front surface of the electrode pad.

Therefore, the present technology is applicable to flip-chip bonding to miniaturize an electrode pad of a semiconductor chip. The present technology is also applicable to fields of producing various semiconductor apparatuses and components thereof.

The embodiments and concrete examples of implementation discussed in the foregoing detailed explanation serve solely to illustrate the technical details of the present technology, which should not be narrowly interpreted within the limits of such embodiments and concrete examples, but rather may be applied in many variations within the spirit of the present technology, provided such variations do not exceed the scope of the patent claims set forth below.

What is claimed is:

1. A bump structure, comprising:
a squashed ball provided on an electrode pad; and
a plurality of wires each provided on the squashed ball, the plurality of wires each being a wire loop that is loop-shaped and is formed so as to protrude from an end part of the squashed ball, and the wire loop being formed in such a manner that a plane surrounded by the wire loop is oriented either substantially orthogonal or substantially parallel to a top surface of the electrode pad.

2. A semiconductor apparatus, comprising a bump structure including:
a squashed ball provided on an electrode pad; and
a wire provided on the squashed ball, the electrode pad being provided on a semiconductor chip and bonded, via the bump structure by flip-chip bonding, to a bonding pad provided on a base substrate, and the wire being a wire loop that is loop-shaped and is formed so as to protrude from an end part of the squashed ball, the electrode pad and the bonding pad being offset in a lateral direction, wherein the electrode pads formed on the semiconductor chip are spaced a distance of 60 µm or less from each other.

3. The semiconductor apparatus of claim 2, wherein the wire loop is formed in such a manner that a plane surrounded by the wire loop is oriented substantially orthogonal to a top surface of the electrode pad.

4. The semiconductor apparatus of claim 2, wherein the wire loop is formed in such a manner that a plane surrounded by the wire loop is oriented substantially parallel to a top surface of the electrode pad.

5. The semiconductor apparatus of claim 2, wherein the wire comprises first and second wires, each of the first and second wires being a wire loop that is loop-shaped and that is formed so as to protrude from an end part of the squashed ball, wherein the first wire is coupled to a first bonding pad on the base substrate, and wherein the second wire is coupled to a second bonding pad on the base substrate.

6. A semiconductor apparatus, comprising a bump structure including:
a squashed ball provided on an electrode pad; and
a plurality of wires each provided on the squashed ball, the electrode pad being provided on a semiconductor chip and bonded, via the bump structure by flip-chip bonding, to a bonding pad provided on a base substrate, and the plurality of wires each being a wire loop that is loop-shaped and that is formed so as to protrude from an end part of the squashed ball, and the wire loop being formed in such a manner that a plane surrounded by the wire loop is oriented either substantially orthogonal or substantially parallel to a top surface of the electrode pad.

7. The semiconductor apparatus of claim 6, wherein the bump structure is formed on the electrode pad in a corner section of the semiconductor chip.

8. A semiconductor apparatus, comprising:
a base substrate having bonding pads;
a semiconductor chip having electrode pads; and
a bump structure that bonds a first electrode pad of the semiconductor chip to a first bonding pad of the base substrate, the bump structure including:
a squashed ball provided on the first electrode pad of the semiconductor chip, and
a wire provided on the squashed ball, the wire being a wire loop that is loop-shaped and that is formed so as to protrude from an end part of the squashed ball, wherein the first electrode pad is offset from the first bonding pad in a lateral direction, wherein the wire loop is coupled to the first bonding pad, and wherein a distance between the bonding pads on the base substrate is greater than a distance between the electrode pads on the semiconductor chip.

9. The semiconductor apparatus of claim 8, wherein the wire loop is formed in such a manner that a plane surrounded by the wire loop is oriented substantially orthogonal to a top surface of the first electrode pad.

10. The semiconductor apparatus of claim 9, wherein the wire provided on the squashed ball comprises first and second wires, each of the first and second wires being a wire loop that is loop-shaped and that is formed so as to protrude from an end part of the squashed ball, wherein the first wire is coupled to the first bonding pad on the base substrate, and wherein the second wire is coupled to a second bonding pad on the base substrate.

11. The semiconductor apparatus of claim 8, wherein the wire loop is formed in such a manner that a plane surrounded by the wire loop is oriented substantially parallel to a top surface of the first electrode pad.

12. The semiconductor apparatus of claim 11, wherein the wire provided on the squashed ball comprises first and second wires, each of the first and second wires being a wire loop that is loop-shaped and that is formed so as to protrude from an end part of the squashed ball, wherein the first wire is coupled to the first bonding pad on the base substrate, and wherein the second wire is coupled to a second bonding pad on the base substrate.

13. The semiconductor apparatus of claim 8, wherein the wire provided on the squashed ball comprises first and second wires, each of the first and second wires being a wire loop that is loop-shaped and that is formed so as to protrude from an end part of the squashed ball, wherein the first wire is coupled to the first bonding pad on the base substrate, and wherein the second wire is coupled to a second bonding pad on the base substrate.

* * * * *